United States Patent
Eaton et al.

(10) Patent No.: US 10,748,734 B2
(45) Date of Patent: Aug. 18, 2020

(54) MULTI-CATHODE EUV AND SOFT X-RAY SOURCE

(71) Applicants: Mark F Eaton, Austin, TX (US); Robert J. Hollingsworth, Austin, TX (US)

(72) Inventors: Mark F Eaton, Austin, TX (US); Robert J. Hollingsworth, Austin, TX (US)

(73) Assignee: STELLARRAY, INC., Austin, TX (US)

(*) Notice: Subject to any disclaimer, the term of this patent is extended or adjusted under 35 U.S.C. 154(b) by 346 days.

(21) Appl. No.: 15/256,692

(22) Filed: Sep. 5, 2016

(65) Prior Publication Data

US 2018/0068821 A1    Mar. 8, 2018

(51) Int. Cl.
| | |
|---|---|
| H01J 35/06 | (2006.01) |
| H01J 35/08 | (2006.01) |
| H01J 29/08 | (2006.01) |
| G03F 7/20 | (2006.01) |
| G21K 1/06 | (2006.01) |

(52) U.S. Cl.
CPC ............ *H01J 35/08* (2013.01); *G03F 7/7005* (2013.01); *H01J 29/085* (2013.01); *H01J 35/06* (2013.01); *H01J 35/112* (2019.05); *G21K 1/067* (2013.01); *G21K 2201/067* (2013.01); *H01J 2235/062* (2013.01); *H01J 2235/068* (2013.01); *H01J 2235/086* (2013.01)

(58) Field of Classification Search
None
See application file for complete search history.

(56) References Cited

U.S. PATENT DOCUMENTS

| | | | | |
|---|---|---|---|---|
| 3,867,637 A | * | 2/1975 | Braun | G03B 42/026 378/2 |
| 4,872,189 A | * | 10/1989 | Frankel | B82Y 10/00 378/119 |
| 5,426,686 A | | 6/1995 | Rentzepis | |
| 5,729,583 A | * | 3/1998 | Tang | A61B 6/145 378/122 |
| 5,940,469 A | * | 8/1999 | Hell | H01J 35/08 378/136 |
| 6,141,400 A | * | 10/2000 | Schardt | H01J 35/00 378/119 |
| 6,333,968 B1 | * | 12/2001 | Whitlock | B82Y 10/00 378/122 |
| 6,947,522 B2 | * | 9/2005 | Wilson | H01J 35/10 378/124 |
| 6,975,703 B2 | * | 12/2005 | Wilson | H01J 35/30 378/119 |
| 7,266,178 B2 | * | 9/2007 | Grodzins | G01T 1/167 378/122 |

(Continued)

Primary Examiner — Thomas R Artman

(57) ABSTRACT

An efficient source of EUV or SXR flux uses multiple e-beams from multiple cathodes to impact a wide anode target with a flux-generating surface to generate flux over a wide area. The conversion efficiency of e-beam power to flux power may be improved by the direction of the e-beams towards the anode target at shallow or grazing incidence angles or the use of mirrored anode surfaces which reflect EUV or SXR. The source is enclosed in a vacuum chamber and performs work such as the penetration of photoresist on a semiconductor wafer in vacuum.

16 Claims, 9 Drawing Sheets

(56) References Cited

U.S. PATENT DOCUMENTS

| | | | |
|---|---|---|---|
| 7,949,102 B2 | 5/2011 | Behling | |
| 8,094,784 B2 * | 1/2012 | Morton | G21K 1/02 378/124 |
| 8,155,273 B2 * | 4/2012 | Eaton | H01J 35/065 378/122 |
| 8,472,586 B2 * | 6/2013 | Ueda | H01J 35/065 378/121 |
| 8,861,686 B2 * | 10/2014 | Kim | G03B 42/02 378/149 |
| 9,001,973 B2 * | 4/2015 | Morton | G21K 1/02 378/124 |
| 9,324,535 B2 * | 4/2016 | Eaton | A61L 2/082 |
| 2005/0025283 A1 * | 2/2005 | Wilson | H01J 35/30 378/124 |
| 2007/0108396 A1 | 5/2007 | Reinhold | |
| 2007/0187625 A1 | 8/2007 | Wieland et al. | |
| 2007/0189459 A1 * | 8/2007 | Eaton | H01J 35/065 378/143 |
| 2008/0152090 A1 * | 6/2008 | Yamada | G03F 7/70008 378/124 |
| 2009/0080614 A1 * | 3/2009 | Eaton | H01J 35/065 378/122 |
| 2010/0189221 A1 * | 7/2010 | Eaton | A61L 2/082 378/68 |
| 2010/0189222 A1 * | 7/2010 | Eaton | G21K 1/025 378/68 |
| 2010/0189223 A1 * | 7/2010 | Eaton | G21K 1/025 378/68 |
| 2013/0272503 A1 * | 10/2013 | Eaton | A61L 2/082 378/134 |
| 2015/0357148 A1 * | 12/2015 | Morton | G21K 1/02 378/143 |
| 2018/0068821 A1 * | 3/2018 | Eaton | H01J 35/08 |

* cited by examiner

MULTI-CATHODE EUV AND SOFT X-RAY SOURCE

PRIORITY DATA

Continuation in part of application Ser. No. 14/214,811, which is a continuation in part of application Ser. No. 12/692,472, filed on Jan. 22, 2010, which is a continuation in part of application Ser. No. 12/201,741, filed on Aug. 29, 2008, issued as U.S. Pat. No. 8,155,273, which is a continuation in part of application Ser. No. 11/355,692, filed on Feb. 16, 2006, now abandoned, all of which are incorporated herein in their entirety.

TECHNICAL FIELD OF THE INVENTION

This invention relates in general to the field of radiation sources and more particularly to extreme ultraviolet (EUV) and soft x-ray (SXR) sources.

BACKGROUND OF THE INVENTION

This invention provides a source of EUV or SXR (EUV/SXR) Bremsstrahlung and characteristic line radiation with improved power and performance over the existing art. Such sources are particularly useful in photolithography for very fine feature size devices.

Considerable efforts are being made for the development of next generation photolithography tools. The semiconductor industry now plans to move from device feature sizes of tens of nanometers (nm) to a node, meaning a feature size for which the needed tools and materials (light sources, photomasks, photoresists, etc.) are being developed, in the EUV range of around 13.5 nm. Beyond that, plans call for nodes in the single or few nm, or SXR, range. The photon flux (or light) sources for processing wafers in these ranges have proved difficult to develop. Flux in the 100 W range and higher is needed for economical processing of wafers in the EUV node. These sources have been repeatedly delayed, however, and reliable, cost-effective sources are not yet available for producing EUV at these power levels.

The most common source for the EUV node uses high energy lasers to strike droplets of molten tin in vacuum, a process which produces intense EUV flux that is then collected by mirrors and transmitted through optical elements to the wafer being processed. EUV processing must be done in vacuum, since all nearly all materials absorb EUV. The tin droplet sources produce debris that contaminates the chambers, collection mirrors and demagnification optics used for projection lithography. They also make for extremely expensive photolithography tools, which are estimated to cost over $100 million. The power efficiency of these tools is also low; the flux reaching the wafer has only $10^{-4}$ of the input power needed for these tools. Power sources for the tin droplet EUV flux sources are therefore in the 1 MW range. Short source lifetimes and high maintenance costs are other problems with the tin droplet EUV sources. Moreover, other types of sources will be needed for progression to SXR nodes, so the massive investments in EUV sources will not be of benefit when that change occurs.

Photomasks are reflective in the EUV node, but could be transmissive in the SXR node, since light at these wavelengths can transmit through some materials. EUV and SXR can be reflected by mirrors made with multiple layers of materials, such as Mo and Si for EUV. Reflective EUV photomasks and the projection optics used in lithography tools make use of such mirrors.

It is known in the art that EUV and SXR can be produced in a manner similar to the way harder x-rays are produced in a standard x-ray tube, i.e. by hitting an anode target with an accelerating electron beam from a cathode. Several materials, such as Si, SiC, Be, Mo, Cu and alloys thereof, can produce characteristic line, and Bremsstrahlung, radiation in the 10-15 nm range, and other materials can be used as anodes for SXR. In particular, Si and SiC produce characteristic line radiation around 13.5 nm. Shell electrons of atoms in the target are ejected from their shell through electron impact excitation by the electrons from the cathode. The unoccupied shell is quickly refilled, which results in the emission of a photon from the atom with an energy characteristic of that shell. The radiation is isotropic and independent of the direction of the colliding electron's momentum direction.

Point sources of EUV have been developed in which a Si or SiC anode target is used in a standard x-ray tube configuration, i.e. with an e-beam from a cathode accelerating into an angled anode in an evacuated tube. These, however, have had low ($10^{-5}$) power efficiency, with the best efficiencies produced by an accelerating voltage between cathode and anode of 8 kV to 10 kV. A major reason for this low power efficiency is that the target material absorbs the EUV photons. This is because the characteristic line and other photons are generated at some distance below the surface of the target material. As the accelerating electron voltage is increased the electrons penetrate deeper into the target and the probability impacting one of the electrons in the target material increases. This corresponds to an increase in EUV flux radiating off the target. The increase in flux, however, only increases to a certain point and then starts to decrease. This is because the electrons are then penetrating so deep into the material that the bulk of the EUV photons are absorbed before they can reach the surface of the target. Moreover, a single electron beam cannot impart enough power to the anode for this source to be useful in photolithography, or even in measurement tools. The fundamental process, however, has a number of advantages over the tin droplet sources now being developed, such as the lack of debris and compatibility with use in a vacuum chamber, which also obviates the need for a glass tube.

A need therefore exists for more efficient, more reliable and less expensive EUV and SXR sources that can produce higher flux power, especially for use in photolithography tools.

SUMMARY OF THE INVENTION

The present invention provides an EUV/SXR source which overcomes the limitations and problems of prior art sources by using multiple cathodes to emit multiple electron beams towards one or more wide anode targets in vacuum to generate higher flux power than is possible with single cathode sources directing an e-beam toward one spot on an anode. The use of cathode arrays in this source can allow the generation of flux from a large surface area, as large or larger than the flux target area, which may be a semiconductor wafer or an optical element such as a mirror or mirror array which collects the primary flux generated by the source and then transmits that flux towards a semiconductor wafer. The flux source of the present invention also improves the efficiency of flux generation by directing the electron beams into the anode so that more of the photons can escape the target than is possible with hitting the target head-on or at the angles used in conventional x-ray tubes.

In one aspect of the disclosed invention, multiple cathodes emit multiple e-beams that strike a thin film anode made of a target material at a shallow or grazing angle, so that more of the photons produced in this process can escape the target into vacuum.

In another aspect of the disclosed invention, grazing incidence mirrors direct the generated flux toward the target wafer or toward collection mirrors or other optical elements.

Yet another aspect of the invention is to generate the flux from Si or other flux generating materials that are layered on to mirrored anodes which reflect out more of the flux in a useful direction.

The sources of the present invention may be used to direct flux directly at a reflective or transmissive photomask or towards various collection and focusing optics which then direct flux towards a photomask. These sources can be used in photolithography and other tools which are more efficient, less costly and easier to maintain than prior art sources. They provide a further advantage of being adaptable for use in both the EUV and SXR nodes, so as to reduce the cost of transitioning from one to the other. Tools made with these sources will also be inexpensive enough so that multiples of them may be used to achieve the same or better throughput as prior art sources at less overall expense.

BRIEF DESCRIPTIONS OF THE DRAWINGS

The attached drawings are provided to help describe the structure, operation, and some embodiments of the source of the present invention. Numerous other designs, methods of operation and applications are within the meaning and scope of the invention.

Figure 15:
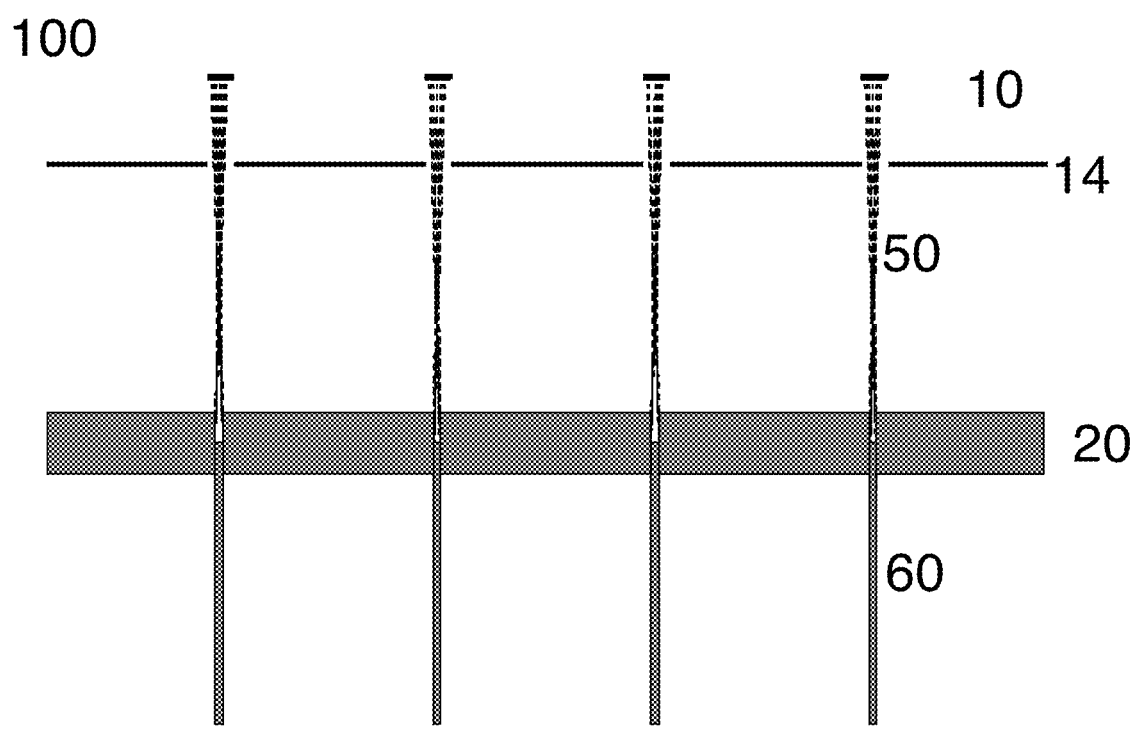

FIG. 15 shows a further embodiment of the source of the present invention in which flux is generated in forward flux channels in an anode substrate. The channels serve to increase the flux generating surface area and to collimate the flux. The channels may be addressed with electron beams either all together or separately. If they are addressed separately, the flux from individual channels may be used to pattern individual small areas of a wafer.

Figure 16:
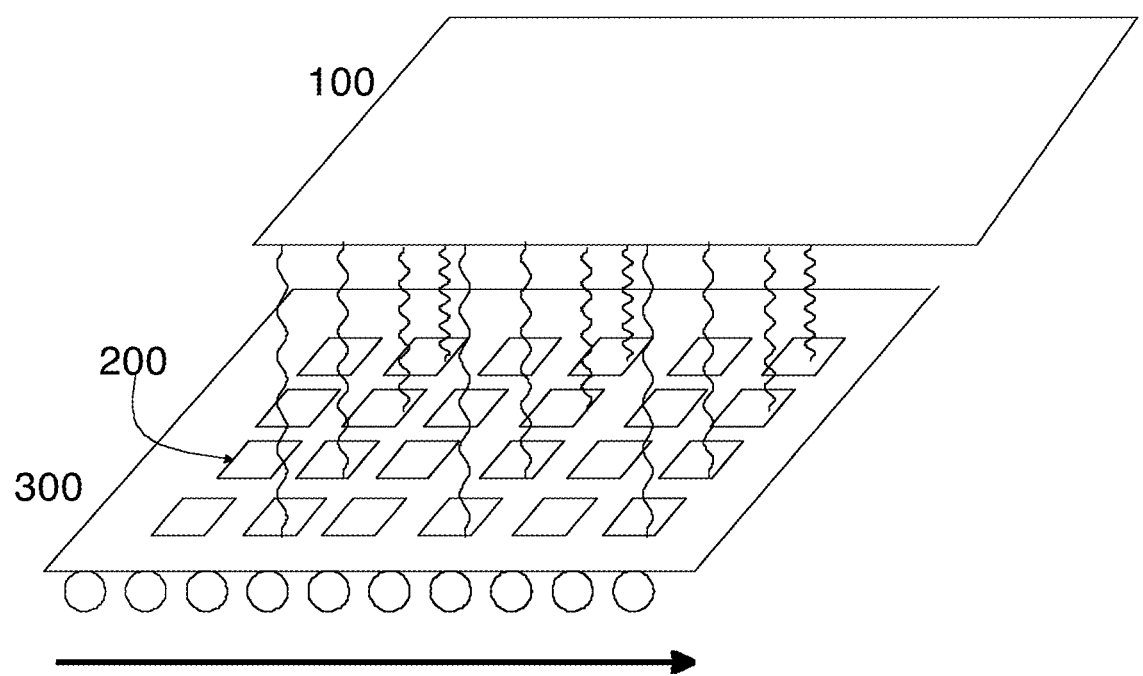

FIG. 16 shows a lithography system using the source of the present invention in which multiple sources are tiled together to provide an EUV or SXR light-emitting surface, under which a conveyance system transports multiple rows of semiconductor wafers.

DETAILED DESCRIPTION OF THE INVENTION

Although the following detailed description delineates specific attributes of the invention and describes specific designs and fabrication procedures, those skilled in the arts of radiographic imaging or radiation source production will realize that many variations and alterations in the fabrication details and the basic structures are possible without departing from the generality of the processes and structures.

The most general attributes of the invention relate to the generation of EUV or SXR flux from a wide anode target struck by multiple e-beams from multiple cathodes. Another key aspect of the source of the present invention is the improvement of the conversion efficiency of e-beam power to light flux by the direction of the e-beams towards the anode target at shallow or grazing incidence angles and by the use of mirrored surfaces for flux generation, collimation and transmission. The source is enclosed in a vacuum chamber and performs work such as the penetration of photoresist on a semiconductor wafer in vacuum. These sources do not generate the debris of metal plasma EUV sources. Outgassing contaminants may be mitigated by the use of evaporated or non-evaporable getters in the vacuum chamber. The sources may also be constructed, however, so as to allow the interaction of plasma from partial gas pressures to enhance flux generation.

The cathodes in the cathode array can be cold cathode field emitters, thermal filament emitters, dispenser cathodes or any other cathode that will fit into the source. E-beams from these cathodes impact the anode target at multiple locations, to produce EUV or SXR flux across the surface of one or more anode targets. Exemplary cathodes for the array are lateral thin film edge emitters, which may be made of various, materials, including carbon, layered films of different forms of carbon, carbon nanotubes or graphene, layered films of metal, layered films of metal and carbon, etc.

Cathodes in the array may be stabilized by the incorporation of resistors for individual emitters or areas. Thermal filament cathodes may also be used, for example thin wires of W or thoriated W disposed perpendicular to the intended direction of the e-beam towards the anode target. The cathodes in the array may also be gated, so as to allow operation of the cathodes at lower voltages. Gates and focusing elements, such as electrostatic lenses, may be provided so as to direct the e-beams in an optimal direction. The cathode-to-anode accelerating potential is biased at a sufficient voltage for the production of EUV or SXR flux at the anode. In some embodiments of the source this will be between 5 kV and 10 kV.

The anode target has a surface containing a material, such as Si or SiC, which will produce Bremsstrahlung and characteristic line radiation when impacted by the e-beams. This anode surface layer may preferably be constructed so as to accept the incoming e-beam at a thin edge, or at a shallow or grazing incidence angle, so as to allow the electrons to travel further at the surface of this layer before scattering into the anode and producing flux too deep for it to escape into vacuum. This improves the conversion efficiency of the source. Providing this longer travel distance for the electrons, for example by providing a metal anode on the distal side of an insulating Si layer, allows a higher cathode-anode bias to efficiently be used, which further increases the conversion efficiency of the source.

There are numerous configurations of the anode beyond the flux-emitting surface. The anode may be a simple Si or SiC substrate, such as a wafer used in semiconductor manufacturing. If the flux-generating material is a semiconductor, it may be made of either conductive or insulating material. The flux-generating material may also be a thin film deposited on another substrate, such as a metal plate or an alumina wafer. The anode target may also comprise layers of the target material and other material, such as Mo, to make a reflecting mirror for EUV or SXR. This will further improve the conversion efficiency of the source. The flux generating material of the anode may be made in other forms than thin films or solid substrates. For example, porous Si may be formed on a substrate. The porosity increases the available surface area of the anode so as to generate higher flux. Particles of flux-generating material may also be deposited on an anode substrate, such as particles of Si, or mirrored particles of Si coated on Mo. These particles may be of various sizes, ranging from a few nm to tens of microns. These also provide a larger surface area for flux generation and increase conversion efficiency.

Tools made using the sources of the present invention may incorporate multiples of these sources. Sources may be tiered so as to provide a wider area of flux emission. Numerous sources may be arranged around optical elements in the tool. The surface area of the sources used in a photolithography tool, for example, can exceed a square meter.

The anodes in a multiple source application may in one embodiment be constructed of thin substrates or ribbons of material, such as a metal, coated with the flux generating material or mirrored films that include flux-generating material. These thin substrates or ribbons may be oriented so as to accept incoming e-beams on one side at a shallow or grazing incidence angle and generate flux which exits out the other side between gaps in these anodes. Mirrored films will further increase source efficiency in this embodiment. Concentric rings of films may be arranged around a flux target, such as a wafer or an optical element in a tool, so as to direct the flux into said target. The films may be angled in relation to each other so as to direct the flux from a wide array of such rings into a smaller target area. This embodiment provides a very large flux generating area of the sources in relation to the flux target area.

Heat is generated during flux production and needs to be conducted away from the flux-generating surface so as to avoid damage such as pitting, melting or flaking. Several means may be employed to dissipate heat in the source. The substrate may be made of a material, such as copper, diamond or alumina, with high thermal conductivity. Fluid cooling channels, heat pipes of various sorts, and thermal conduction layers of materials such graphene or carbon nanotubes may be built into the anodes. Metal frames which dissipate heat may also support the anodes. The sources may also be disposed so as to direct radiant heat away from the source elements and heat sensitive elements of the system or tool in which they are being used.

An exemplary use of the source of the present invention is in EUV and other nanometer-scale photolithography. Sources may be used in various configurations. In one embodiment, they may be disposed so as to emit flux directly at a reflective or transmissive photomask. They may also be disposed so as to emit flux towards a condensing mirror, mirror array or condensing optics, such as those made of angled grazing incidence mirrors, which in turn direct the flux toward a photomask or substrate. In another embodiment, sources of the present invention may be used in maskless lithography with pinholes or flux-collimating structures used to make very small flux spots which are individually addressed, or addressed in patterned groups to make patterns on the wafer. In a further embodiment, semiconductor wafers may be transported through a photolithography tool incorporating sources of the present invention covering a wide area to increase throughput time and the uniformity of EUV or SXR flux distribution over the surface of the substrates. One tool may also process several lines of wafers being transported through the exposure section of the tool in parallel. For example, an exposure tool using sources of the present invention, including those using collection mirrors, may provide an EUV or SXR emitting area several meters on a side. An exposure area 5 meters wide could process ten lines of 450 mm wafers running through the tool in parallel. The exposure area might be 5 meters or more long as well.

Various embodiments of the source of the present invention are illustrated with reference to the accompanying drawings.

Figure 1:
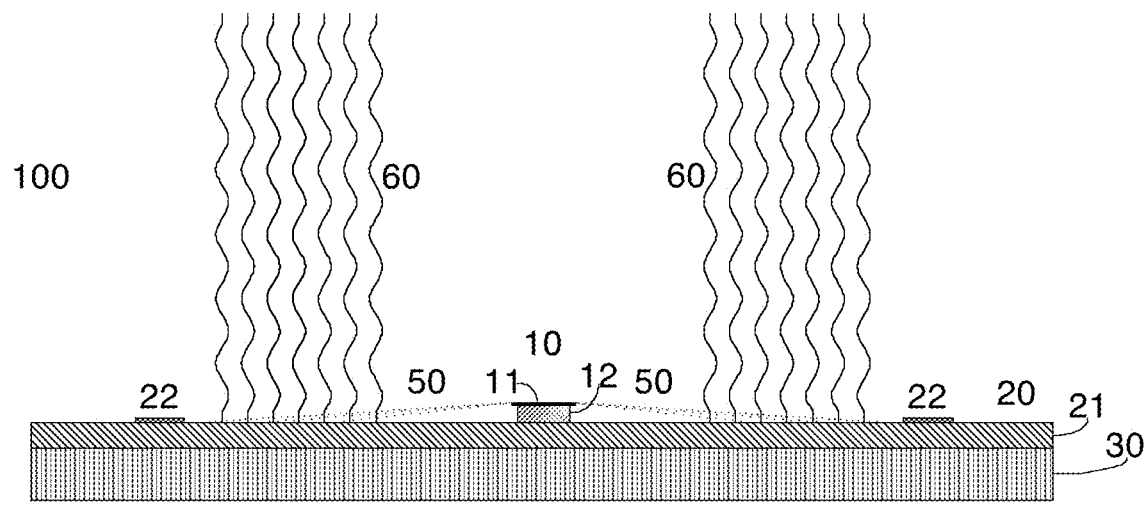
FIG. 1 shows an EUV/SXR source of the present disclosure in which e-beams emitted from a cathode are directed at an anode so that the e-beams strike a flux generating material between cathode and anode at a shallow angle so as to generate flux and allow a high number of photons to escape this material into vacuum.

FIG. 1 shows an embodiment of source 100 in which anode 20 is comprised of anode electrode 22, which is formed on layer 21 of insulating, or only slightly conductive, Si or other flux-generating material. This layer in turn is formed on substrate 30. E-beams 50 emitted from cathode 10 are accelerated towards electrode 22, but since the thin film field emission emitter 11 is raised only slightly off layer 21 by insulating block 12, the e-beam is directed at electrode 22 at a very shallow angle, so most of the electrons hit the silicon, over a long path on the way to electrode 22, with their momentum keeping them skimming along or just under the surface of the Si film. A percentage of these electrons will generate isotropic EUV flux, a portion 60 of which will escape into vacuum. As shown in the figure, thin-film edge emitter 11 can emit e-beams from two sides, or the source can be made so that e-beams are emitted from several sides of the cathode, or in a circular pattern. Exemplary accelerating potentials between cathode and anode electrode are in the 5 kV to 109 kV range. Substrate 30 may be made of metal, alumina or some other material with high thermal conductivity, and may also incorporate fluid cooling channels or heat pipes. Intermediate layers of other materials may be used between electrode 22 and layer 21 and between layer 21 and substrate 30 to provide a smoother thermal expansion gradient. In an SXR source materials other than Si may be used in flux emitting layer 21.

Figure 2:
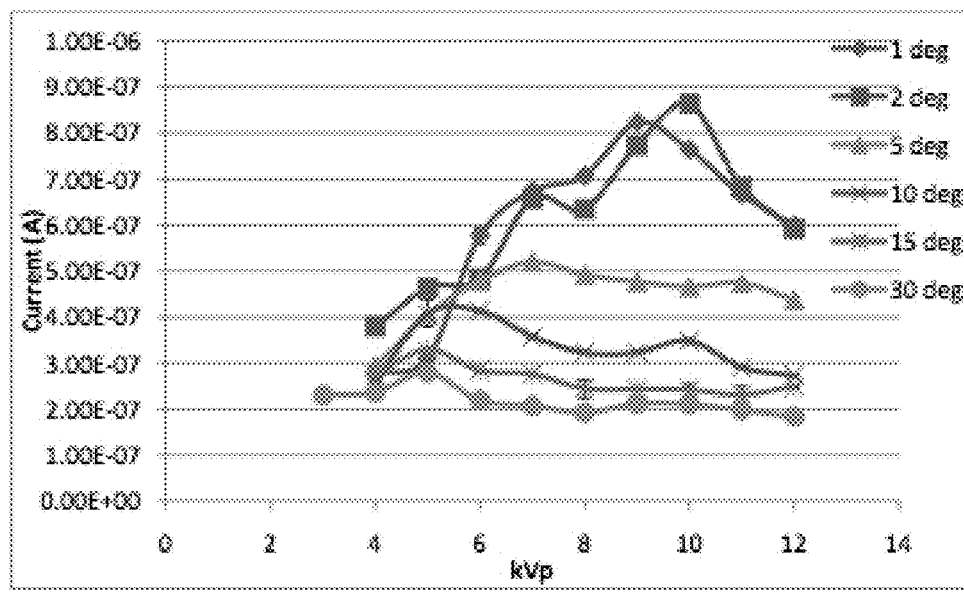
FIG. 2 shows a graph of the change in EUV flux output in a Si target as the angle of incidence of the e-beam is varied.

FIG. 2 shows experimental results of flux generation of e-beams hitting a Si wafer at various angles. The x-axis shows the accelerating voltage and the y-axis shows flux power measured with an EUV sensitive detector. The plotted lines represent results at various angles of the electron source in relation to the surface of the substrate, with a smaller degree angle being a shallow angle such as that depicted in FIG. 1. The data show that flux output increases as the angle gets smaller, with over three times as much flux from a 2 degree angle beam as a 30 degree angle beam. Thinner layers, mirrored layers, hitting the edge of the film with the e-beam and other improvements can further improve flux output.

Figure 3:
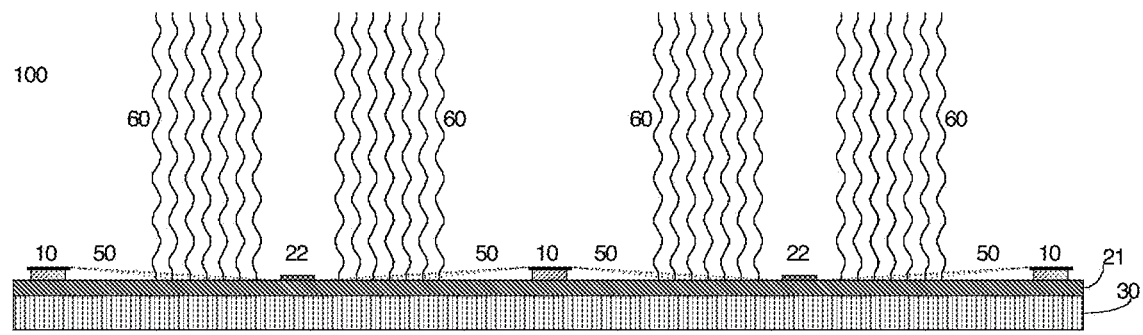
FIG. 3 shows an alternative embodiment of an EUV/SXR source in which multiple cathodes generate e-beams which strike flux-generating material at shallow angles.

FIG. 3 shows a side view of multiple cathode-anode devices of the type depicted in FIG. 1. The flux emitting surface area of this source is larger and may be scaled in x and y directions as needed. It will be seen in the figure that there is little flux emitted near the cathodes. If this areal non-uniformity is a problem, it may be compensated for by moving the source or the flux target in relation to each other.

Figure 4:
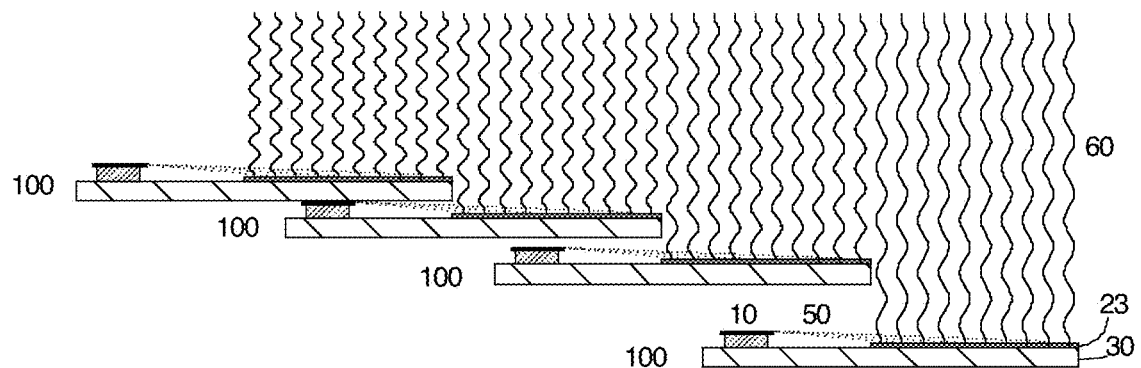
FIG. 4 shows another embodiment of the source in which e-beams generated by cathode strike an anode made of conductive flux-generating material at the edge of a thin film of said anode material. The figure also shows multiple sources tiered in such as way that flux is generated continuously over a wide area.

FIG. 4 shows tiered multiples of source 100, with the sources overlapped so that flux emission is uniform. In this embodiment, the anode is a conductive Si film 23, disposed on an insulating substrate 30. Cathode 10 is raised off of substrate 30 so that part of e-beam 50 impacts the facing edge of anode 23. Cathode 10 may be comprised of stacks of thin film edge emitters so as to spread multiple e-beams more thoroughly over the anode. As shown in this figure, sources 100 are tiered so as to provide a planer source of flux. They may also be angled in relation to each other so as to curve the flux emitting area.

Figure 5:
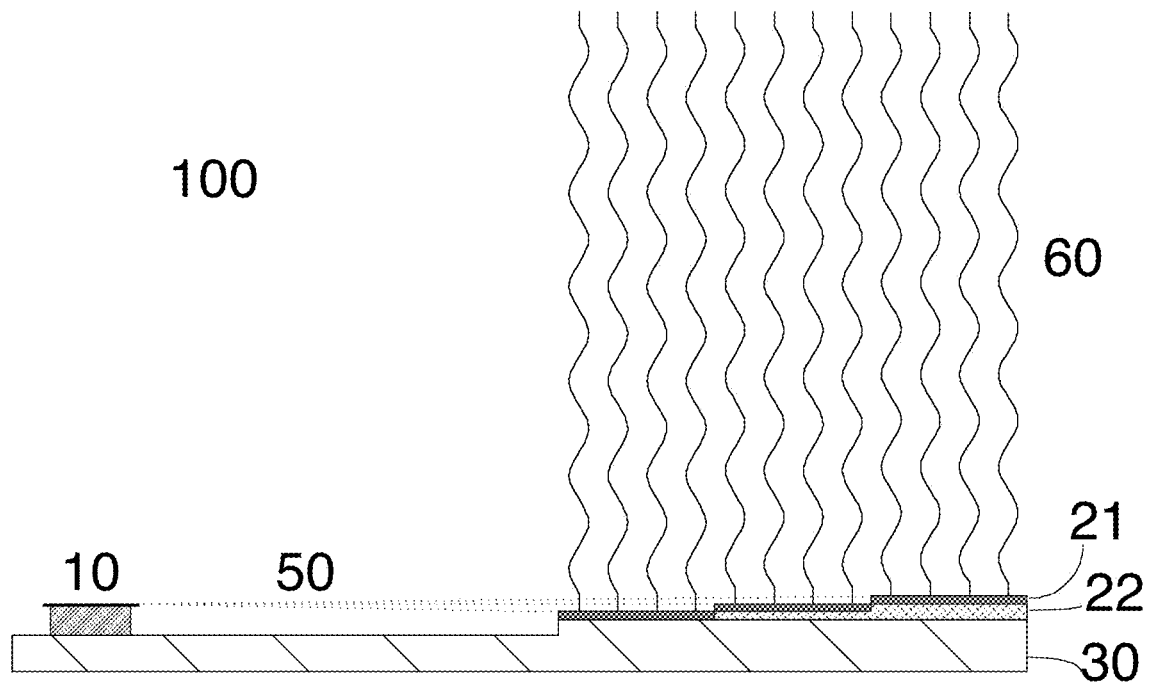
FIG. 5 shows further embodiment of the source of the present invention in which e-beams are directed at tiered anode films, which may be conductive or non-conductive, the tiered anodes providing a wide area of flux generation.

In FIG. 5, the anode is tiered, with insulating Si layer 21 deposited over tiered metal electrode 22. This embodiment allows the flux emitting film to be dimensioned so as to maximize the length over which the e-beams travel through the surface of layer 21 before they scatter. Metal electrode 22 may be made of Mo, so as to make a mirrored surface to increase the production of flux 60 into vacuum.

Figure 6:
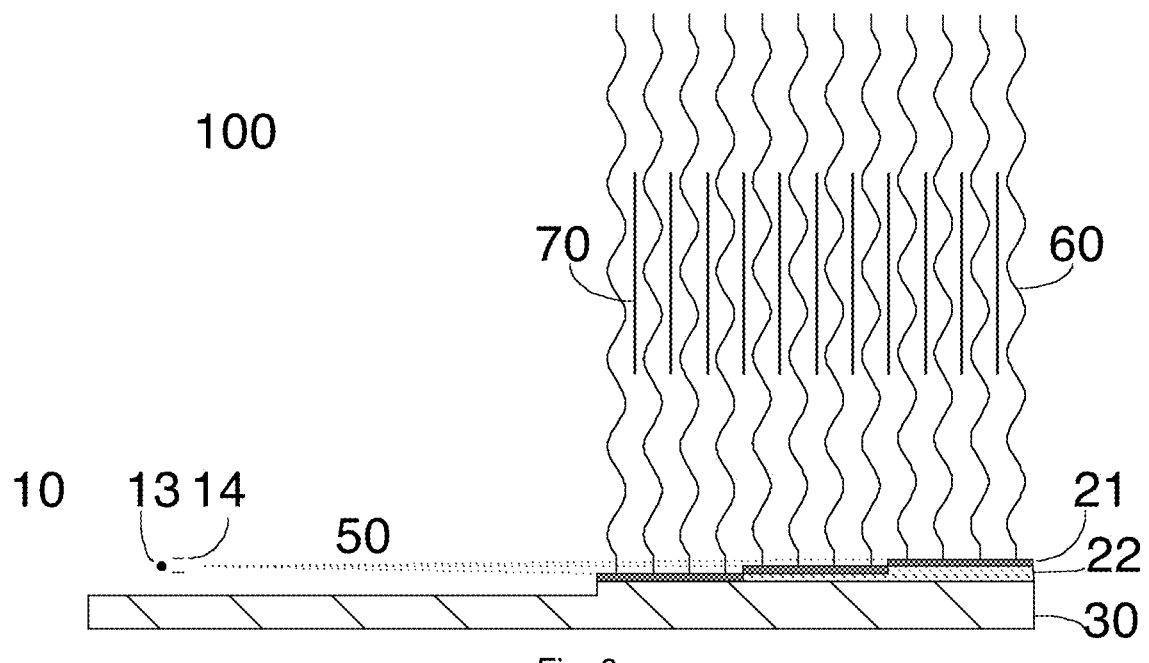
FIG. 6 shows a source in which grazing incidence mirrors are placed over the source so as to collimate the flux.

FIG. 6 depicts the use of a cathode 10 comprised of thermal filament 13, with grid 14 used to extract electrons in the direction of the anode. The anode in this case is the same tiered anode as shown in FIG. 5, although numerous other anode configurations can be used with filament cathodes too. The figure also shows the use of reflective grazing incidence mirrors 70, which may be made of alternating Si and Mo films, to collimate flux 60. The mirrors may be angled to direct flux in a particular direction. They may be angled inwards toward each other at their distal end so as to form a flux focusing optical element.

Figure 7:
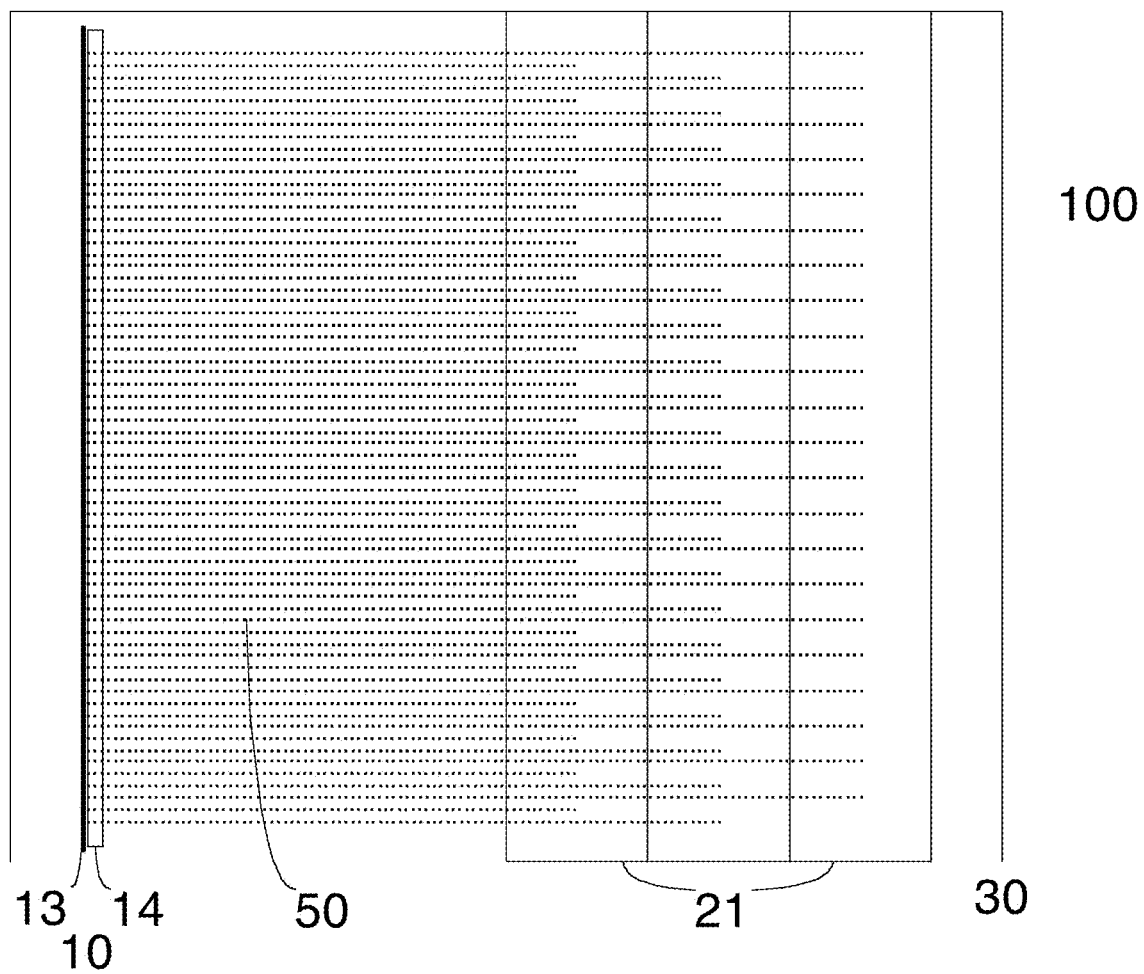
FIG. 7 shows a top view of the source shown in side view in FIG. 6.

FIG. 7 is a top view of the embodiment of FIG. 6. The source may be made very wide to provide a large flux emitting area. In this case, with a filament cathode, periodically spaced insulating supports may be provided to keep the filament from hitting the substrate. Tensioning springs may be provides so as to keep the filament taut in operation, during which the filament will lengthen and shorten as it is heated. The filaments may be made of any thermionic emitting material. Exemplary materials include W wires, thoriated (2.5%) W (Th-W) wires, or low temperature Barium-coated W (Ba-coated W) wire arrays. A current gating grid may be provided between the cathode array and anode, but closer to the cathode array to modulate the electron beam current and to provide more even distribution of the beam current over the anode. A suitable grid voltage will extract electrons from the cloud emitted by the cathodes and direct them towards the anode. As a rule of thumb, the grid voltage is generally most effective at about 100 V per mm of separation between the grid and the cathodes.

Figure 8:
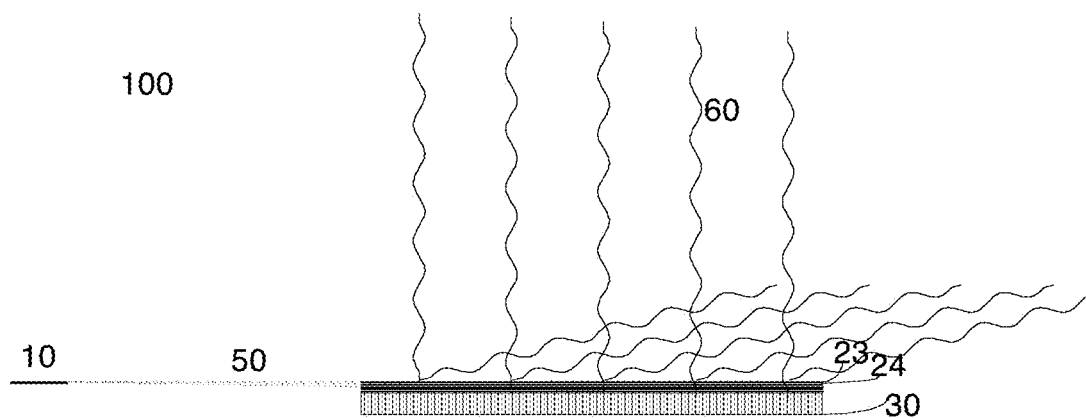
FIG. 8 shows two directions of flux that is generated isotropically from a mirrored anode target film on a substrate.

FIG. 8 shows an embodiment with a mirrored anode, with alternating layers of Si (23) and Mo (24), in the case of EUV, enhancing flux output. The mirrored surface may also comprise molybdenum silicide. The figure also shows another direction of the flux 60, which is emitted isotropically.

Figure 9:
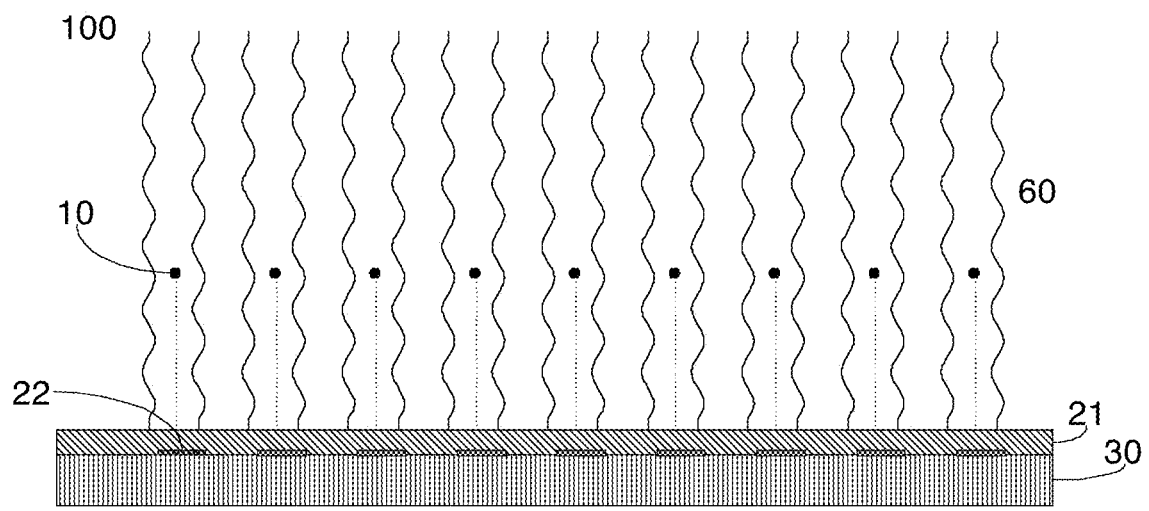
FIG. 9 shows a side view of a reflective source in which a thin film of flux generating material is placed over a substrate.

FIG. 9 shows reflective source 100 in which an insulating thin film 21 of flux emitting material is deposited over metal electrodes 22 on substrate 30. Cathodes 20 in an array emit e-beams which generate flux across the source. Thin film 21 may be of porous silicon of other porous material with vertical walls so as to have the electrons impact at a shallow angle.

Figure 10:
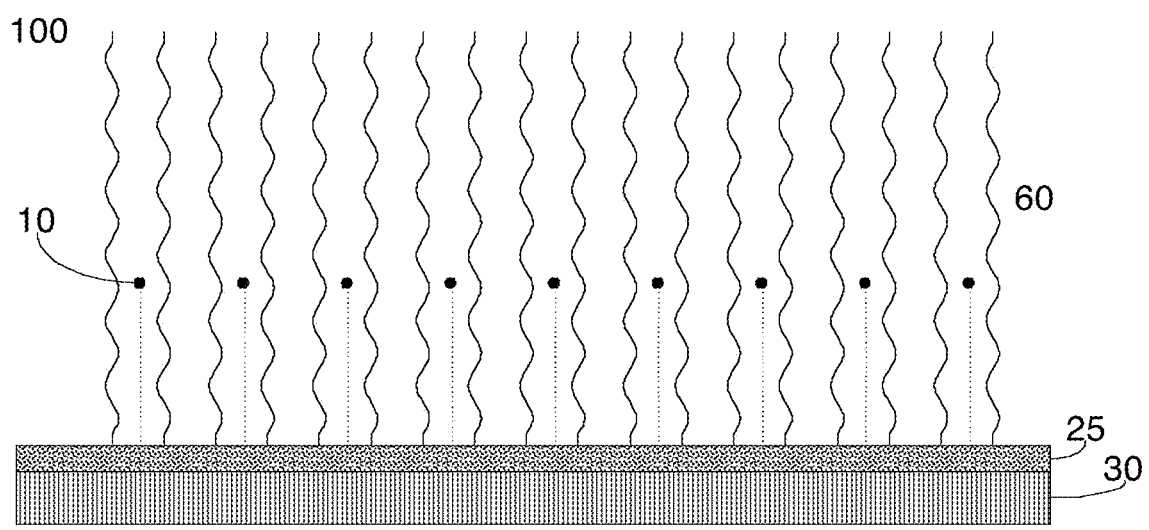
FIG. 10 shows a side view of a reflective source in which a particles of flux generating material are placed over a substrate.

In FIG. 10, the anode is comprised of conductive particles 25 disposed on substrate 30. The particles provide a porosity to this layer so that the e-beams hit at a shallow angle. The particles may be mirrored, for example with Si coatings over Mo particles, and may have diameters of a few nm to tens of microns. These also provide a larger surface area for flux generation and increase conversion efficiency. Si particles may also be embedded in Mo films.

Figure 11:
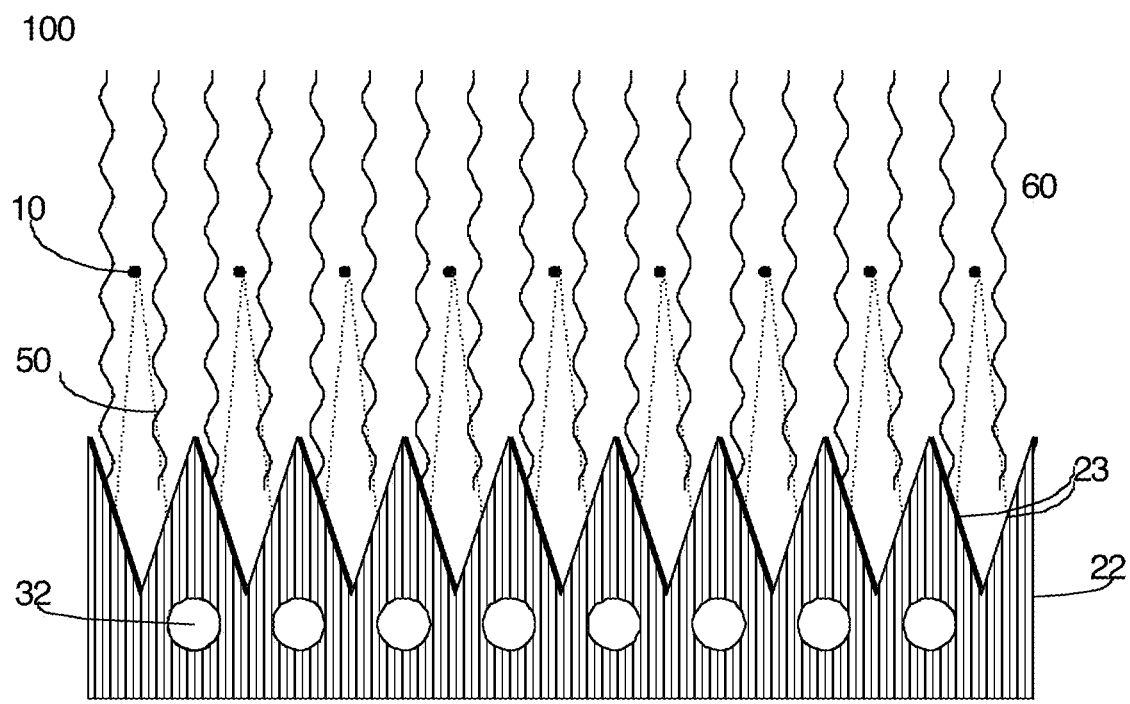
FIG. 11 shows a side view of a reflective source in which the target substrate is grooved so as to provide a larger flux generating surface area and to provide some collimation of the flux. The figure also shows the flux generating material deposited on a metal substrate with cooling channels to as to dissipate heat from the source.

Another embodiment of the present invention is shown in FIG. 11. In this embodiment the anode substrate 22 is grooved so as to provide a larger flux generating surface area and to provide some collimation of the flux. Films or particles of flux generating material 23 are deposited onto this grooved surface. This layer may also have stepped ridges so as to further increase the flux emitting area. The figure also shows fluid cooling channels 32 in the substrate to increase heat dissipation from the source.

Figure 12:
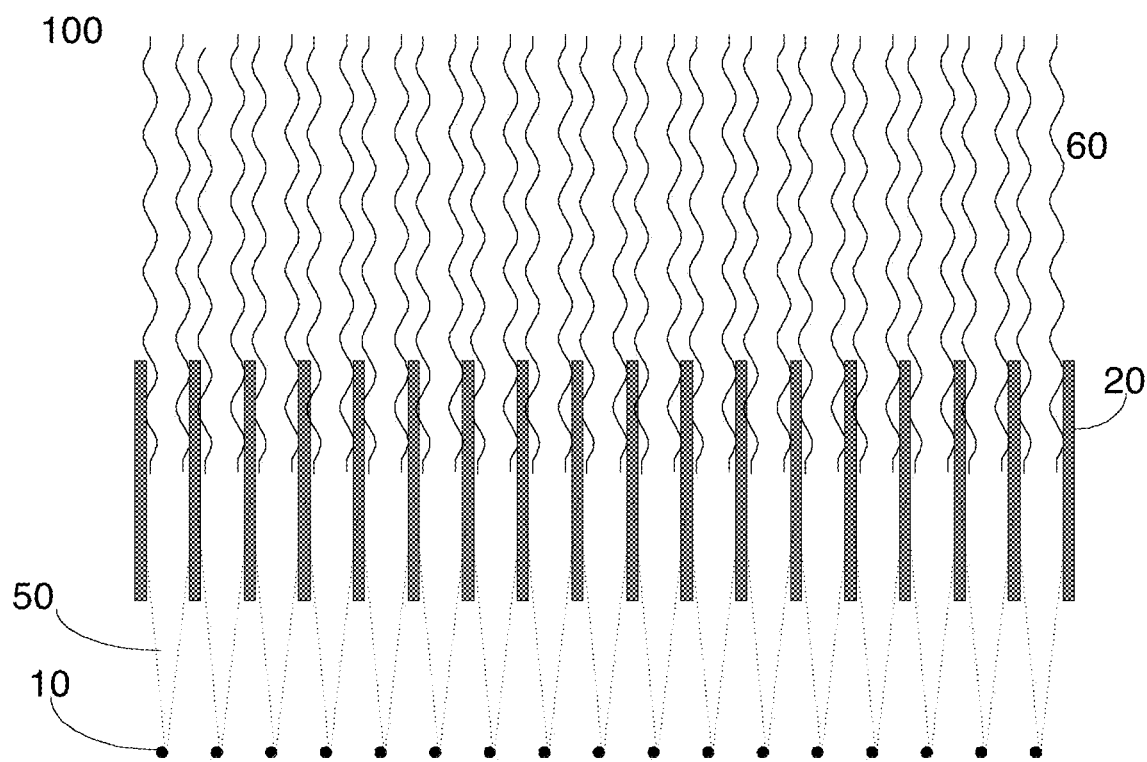
FIG. 12 shows a source in which the multiple cathodes accelerate multiple e-beams towards multiple anode targets comprised of thin ribbons or substrates, which may be coated with flux-generating material or mirrored films of flux-generating material.

In FIG. 12, multiple anodes 20 are comprised of thin substrates or ribbons with a flux-emitting surface. E-beams 50 from cathodes 10 impact these surfaces at shallow angles to generate flux 60 which exits out the other side of the anode array. Anodes 20 can have mirrored surfaces to as to reflect more of the flux out in a useful direction. Multiples of these arrays can be arranged in stacks on top of each other, with the gaps between the arrays aligned so as to allow the passage of the collimated flux. In one embodiment, thin film cathodes can be formed at the ends of the anodes so as to emit e-beams across a vacuum space to the next anode array in the stack. Electrical potentials can be alternated plus and minus between the stacks to that the cathodes of one stack will emit e-beams into the anodes of the next.

Figure 13:
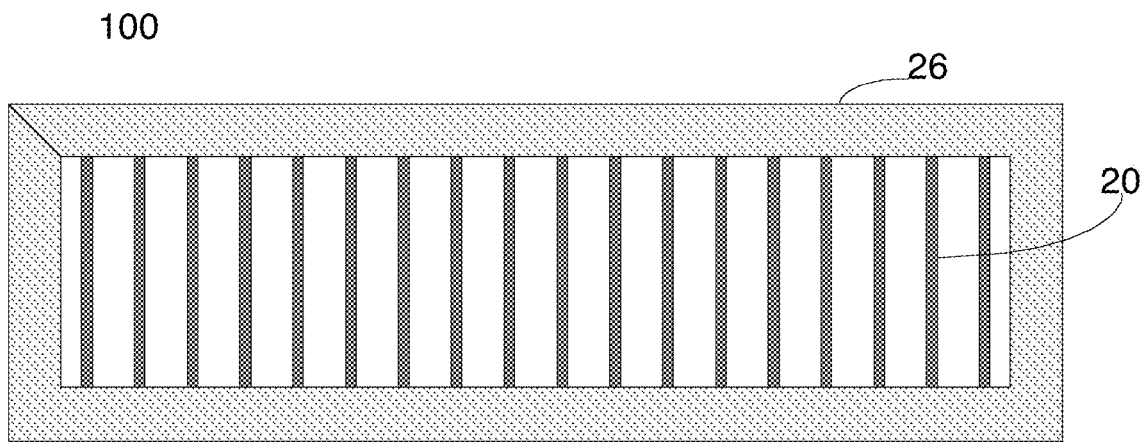
FIG. 13 shows the multiple anode target films or substrates of FIG. 11 strung between a metal frame which serves both to support the films and to carry away heat.

FIG. 13 shows a metal frame 26 used to support the anodes of FIG. 20 and dissipate heat from the anodes.

Figure 14:
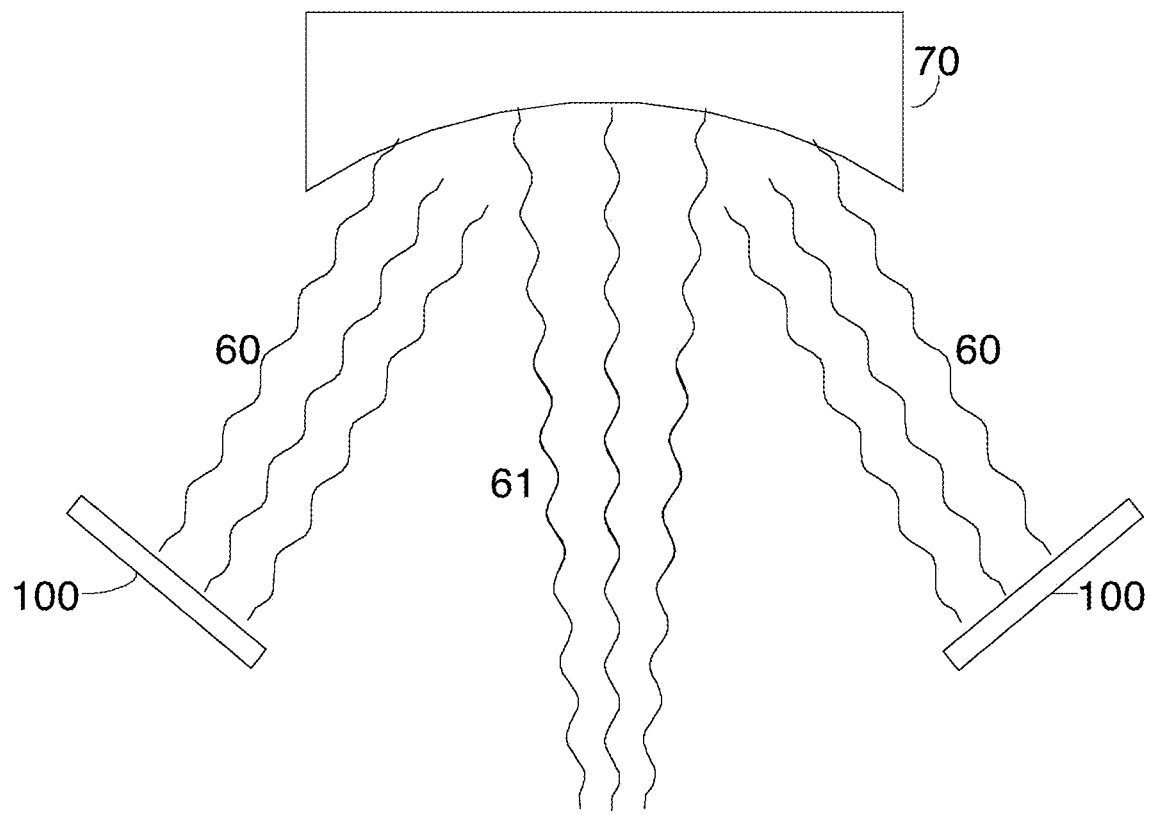
FIG. 14 shows a side view of multiple sources of the present invention emitting flux towards a collection mirror.

FIG. 14 shows one of many possible embodiments of the use of sources 100 in a lithography system. In this embodiment, the sources 100 are arranged underneath curved mirror 70 so as to direct flux into the mirror, which then reflects flux 61, which can be focused, towards the wafer or further optical elements.

FIG. 15 shows a further embodiment of the source of the present invention in which flux 60 is generated in forward flux channels in an anode 20. The channels serve to increase the flux generating surface area and to collimate the flux. Cathodes 10 may be addressed so as to direct e-beams 50, with the help of focusing elements 14, into the channels so as to generate flux from the channels either all together or separately. If they are addressed separately, the flux from individual channels may be used to pattern individual small areas of a wafer.

FIG. 16 shows a lithography system using the source of the present invention in which multiple sources are tiled to provide EUV or SXR light emitting surface 100, under which conveyance system 300 transports multiple rows of semiconductor wafers 200. The system can also be constructed so that the positions of 100 and 300 are flipped and the light emits upwards to wafers passing over the source.

The present invention is well adapted to carry out the objects and attain the ends and advantages described as well as others inherent therein. While the present embodiments of the invention have been given for the purpose of disclosure numerous changes or alterations in the details of construction and steps of the method will be apparent to those skilled in the art and which are encompassed within the spirit and scope of the invention. For example, if the anodes of the source of the present invention are made of nm-scale periodic structures, such as metal blocks or wires, surface plasmon fields generated as some of the e-beams pass by these structures will emit light, the frequency of which can be tuned by the dimensions and spacing of the nm-scale periodic structures.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

The detailed description set forth above in connection with the appended drawings is intended as a description of exemplary embodiments in which the presently disclosed apparatus and system can be practiced. The term "exemplary" used throughout this description means "serving as an example, instance, or illustration," and should not necessarily be construed as preferred or advantageous over other embodiments. Further, although exemplary devices and schematics implement the elements of the disclosed subject matter have been provided, one skilled in the art, using this disclosure, could develop additional hardware to practice the disclosed subject matter and each is intended to be included herein. In addition to the above described embodiments, those skilled in the art will appreciate that this disclosure has application in a variety of arts and situations and this disclosure is intended to include the same.

What is claimed is:

1. A source of Extreme Ultraviolet (EUV) or Soft X-ray (SXR) light flux comprising:
   at least one flat anode substrate with a surface of material emitting EUV or SXR flux in all directions off said surface upon impact by high energy electrons;
   said surface of said anode substrate facing a vacuum space across which is disposed a target to receive EUV or SXR flux emitted from said flat anode substrate;
   at least one cathode disposed to emit at least at least one electron beam to at least one flat anode substrate at a grazing angle to the plane of said EUV or SXR flux-emitting surface of said at least one flat anode substrate, the electrons traveling in said surface at said grazing angle before scattering;
   the emitted EUV or SXR flux traveling across said vacuum to impact said target.

2. The source of claim 1 in which a plurality of cathodes each emits electron beams simultaneously at grazing angles to the plane of at least one EUV or SXR flux-emitting surface of at least one flat anode substrate.

3. The source of claim 1 in which an EUV or SXR mirror layer is disposed under the EUV or SXR flux-emitting surface of the anode, so as to direct additional EUV or SXR flux across the vacuum space to the target.

4. The source of claim 1 in which multiple anodes substrates are laterally staggered with respect to each other so as to increase the EUV or SXR flux-emitting area.

5. The source of claim 1 in which EUV or SXR flux-collimating elements are disposed perpendicular to the flux-emitting surface of the anode substrate.

6. The source of claim 1 in which multiple flat surfaces of EUV or SXR flux-emitting material are tiered on a common flat anode substrate, wherein said surfaces of said flux-emitting material are essentially parallel to the plane of the flat anode.

7. The source of claim 1 in which at least one cathode is disposed on an electrically insulating support layer disposed on top of the EUV or SXR flux-emitting surface of the anode substrate.

8. The source of claim 1 in which:
   multiple anode substrates are spaced apart and parallel to each other in vacuum, each of said substrates having at least one of its two major surfaces comprised of EUV or SXR flux-emitting material;
   at least one cathodes is disposed distal to the space between each pair of anode substrates;
   each cathode emitting e-beams at a grazing angles to the surfaces of said pair of anodes,
   thereby emitting EUV or SXR flux in a direction away from the cathodes.

9. A source of EUV or SXR light flux comprising:
   an anode substrate covered with a layer of porous or particulate material emitting EUV or SXR flux upon impact by high energy electrons, with the space between the pores or particulates occupied by vacuum;
   said anode substrate facing a vacuum space across which is disposed a target to receive EUV or SXR flux emitted from said anode substrate;
   at least one cathode disposed between said anode and said flux target to emit at least one electron beam to said anode substrate at a grazing angle to the pore walls or particle surfaces of said EUV or SXR flux-emitting layer;
   the emitted EUV or SXR flux thereupon traveling across said vacuum space to impact said target.

10. The source of claim 1 in which:
    an anode substrate has multiple holes or slits with inner surfaces of EUV or SXR emitting material;
    into which multiple cathodes disposed to one side of the anode substrate emit electron beams at a grazing angle with respect to the inner surfaces of said holes or slits, the electrons then scattering along opposing surfaces of the holes or slits,
    thereby generating EUV or SXR flux along the inner surfaces of said holes or slits, a portion of which will emit through the holes or slits and out the other side of the anode substrate.

11. The source of claim 1 in which one or more field emission cold cathodes is disposed laterally to the flat anode substrate to extend over substantially the entire length of the edge of said anode substrate proximate said one or more cold cathodes.

12. The source of claim 1 in which one or more thermal filament cathodes, is disposed laterally to the flat anode substrate to extend over substantially the entire length of the edge of said anode substrate proximate said one or more thermal filament cathodes.

13. An EUV or SXR photolithography system in which one of more of the sources of claim 1 produces EUV or SXR flux for the patterning of semiconductor wafers.

14. The photolithography system of claim 13 in which the flux-emitting surfaces of said one or more sources form a flux-emitting area through which multiple lines of wafers or substrates are patterned in parallel.

15. The sources of claim 1 or claim 9 in which the EUV or SXR flux-generating surfaces of one or more anode substrates direct EUV or SXR flux into a collection mirror.

16. The source of claim 9 in which the anode has grooves, ridges or channels so as to increase the light emitting surface area of the anode.

\* \* \* \* \*